(12) United States Patent
Fifield et al.

(10) Patent No.: US 6,420,925 B1
(45) Date of Patent: Jul. 16, 2002

(54) PROGRAMMABLE LATCH DEVICE WITH INTEGRATED PROGRAMMABLE ELEMENT

(75) Inventors: John A. Fifield, Underhill; Erik L. Hedberg, Essex Junction; Claude L. Bertin, South Burlington, all of VT (US); Nicholas M. van Heel, Eagle, ID (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/757,267

(22) Filed: Jan. 9, 2001

(51) Int. Cl.[7] ............................................... H01H 37/76
(52) U.S. Cl. ........................................ 327/525; 327/526
(58) Field of Search .................................. 327/525, 526, 327/202, 203; 365/96, 185.14, 225.7

(56) References Cited

U.S. PATENT DOCUMENTS

| | | | | |
|---|---|---|---|---|
| 5,345,110 A | * | 9/1994 | Renfro et al. | 327/525 |
| 5,448,187 A | * | 9/1995 | Kowalski | 327/525 |
| 5,663,679 A | * | 9/1997 | Manning | 327/567 |
| 5,677,888 A | * | 10/1997 | Lui et al. | 365/225.7 |
| 5,956,282 A | * | 9/1999 | Casper | 365/225.7 |

* cited by examiner

Primary Examiner—Matthew Smith
Assistant Examiner—Paul Dinh
(74) Attorney, Agent, or Firm—Schmeiser, Olsen & Watts

(57) ABSTRACT

According to the present invention, a programable latch device for use in personalizing a semiconductor device is provided that overcomes the limitations of the prior art. The preferred embodiment programmable latch device can use both fuses and antifuses as programmable elements. The programmable latch device provides a solid digital output indicative of the state of the programmable device, and can be reliably read to provide customization and personalization of associated semiconductor devices. The preferred embodiment programable latch device includes an integrated fuse or antifuse as a programmable element in the latch device. By integrating the programmable element into the latch, device size and complexity is minimized. In particular, the number of transistors required drops considerably when compared to prior art approaches.

22 Claims, 9 Drawing Sheets

PROGRAMMABLE LATCH DEVICE WITH INTEGRATED PROGRAMMABLE ELEMENT

BACKGROUND OF THE INVENTION

1. Technical Field

This invention generally relates to semiconductor circuit fabrication, and more specifically relates to antifuses in semiconductor devices.

2. Background Art

The proliferation of electronics in our modern world is in large part due to integrated circuit semiconductor devices. Integrated semiconductor devices are designed and used for widely differing applications. For this reason it is often beneficial to have the ability to "personalize" a semiconductor device during fabrication. Personalization of a integrated devices involves changing the integrated device to meet specific circuit needs. For example, changing the input and output structure of a device to allow it to be used in multiple applications.

Often, it is not cost effective to create separate fabrication lines, with different masks and such, for each small change in the device for associated circuit requirements. For this reason, specific techniques are used to personalize the device, i.e., to make specific changes in the device to meet a particular need. Some techniques use fuses to customize a device for a particular need. To personalize such a device, some of the available fuses are blown by a laser or other means to make the desired changes to the device and associated circuits. Thus, fuses are blown to make a previously closed connection open. Antifuses are used also used to personalize semiconductor devices. Antifuses are devices that perform the opposite function of a fuse. When a sufficient voltage is applied across an anti-fuse structure the structure becomes permanently shorted, and an electrical connection is made. Thus, antifuses are "open" and unconnected until they are "programmed" to provide a closed connection.

Fuses and antifuses are commonly used to provide redundancy in large scale semiconductor devices such as dynamic random access memory (DRAM) and static random access memory (SRAM) products. In particular, fuses and antifuses are used to access spare bit lines and/or word lines to increase yield potential. Typically, the semiconductor device is built and then tested. Some types of flaws in the device, such as bad bit lines in a DRAM, can be repaired by blowing an appropriate fuse. In the case of fuses, the fuse links can be polysilicon or metal and can be blown by focusing an appropriate pulse of laser energy on the target fuse. When the laser strikes, the fuse link is vaporized and evaporated upward. This makes the previously closed connection "open".

Fuses and antifuses are also used to "program" devices. For example, a bank of eight fuses can be used as a "programming word", with each fuse being either a one or a zero. Thus programmed, the bank of fuses provides a programming word that is used to control the rest of the device.

There are generally two types of fuses today used in integrated semiconductor devices. The first type is called a "laser" fuse. These fuses are blown using laser ablation prior to packaging the integrated semiconductor device. The second type of fuse is an "electronic" fuse. These fuses are blown by providing an amount of current through the fuse such that the fuseable link breaks down. Electronic fuses have the advantage of being able to be programmed after the device has been packaged.

One difficulty in using fuses and antifuses in integrated circuit devices is their propensity to result in randomly floating voltage levels after programming. For example, a blown fuse is an open circuit and typically has variable resistance. This results in inconsistent amounts of current and voltage across the blow fuse. This inconsistent voltage and current negatively effects digital devices. To overcome this the prior art uses latches that are connected to the fuse or antifuse. The latch produces a solid digital output from the relatively variable fuse or antifuse, with the latched digital output being indicative of the state of the fuse or antifuse. Thus, the variable nature of the fuse or antifuse is dealt with using the latch.

One problem with the use of latches connected to fuses is the amount of area consumed by the latches. Most typical latches used with fuses use up to twelve transistors, resulting in excessive device size. Further, as fuse pitch gets tighter, it becomes more difficult to use these latches with fuses and antifuses.

Therefore, there existed a need to provide an improved structure and method for integrated fuses and antifuses that produces reliable digital outputs while minimizing device size.

DISCLOSURE OF INVENTION

According to the present invention, a programable latch device for use in personalizing a semiconductor device is provided that overcomes the limitations of the prior art. The preferred embodiment programmable latch device can use both fuses and antifuses as programmable elements. The programmable latch device provides a solid digital output indicative of the state of the programmable device, and can be reliably read to provide customization and personalization of associated semiconductor devices.

The preferred embodiment programable latch device includes an integrated fuse or antifuse as a programmable element in the latch device. By integrating the programmable element into the latch, device size and complexity is minimized. In particular, the number of transistors required drops considerably when compared to prior art approaches.

The foregoing and other features and advantages of the invention will be apparent from the following more particular description of preferred embodiments of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

According to the present invention, a programable latch device for use in personalizing a semiconductor device is provided that overcomes the limitations of the prior art. The preferred embodiment programmable latch device can use both fuses and antifuses as programmable elements. The programmable latch device provides a solid digital output indicative of the state of the programmable device, and can be reliably read to provide customization and personalization of associated semiconductor devices. The preferred embodiment programable latch device includes an integrated fuse or antifuse as a programmable element in the latch device. By integrating the programmable element into the latch, device size and complexity is minimized. In particular, the number of transistors required drops considerably when compared to prior art approaches.

The preferred embodiment programmable latch device can be used where ever fuses and antifuses are needed with a reliable digital output. For example, the preferred embodiment programmable latch device can be used to latch locations of defective storage locations, or change electrical configuration, or program an electronic circuit or logic block, etc.

Figure 1:
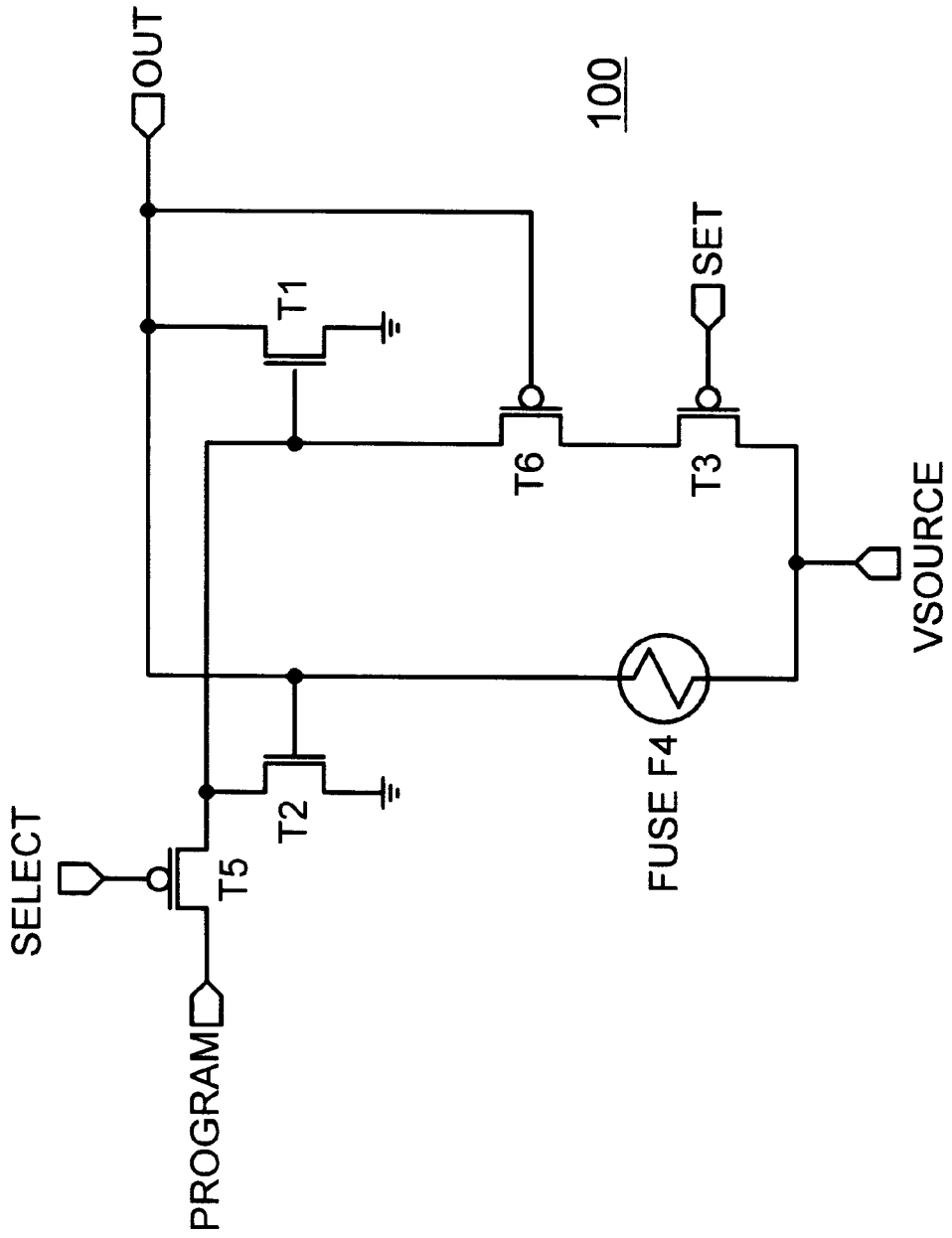
FIG. 1 is a schematic circuit diagram of an unprogrammed programmable latch device in accordance with the preferred embodiment.

Turning now to FIG. 1, a programmable latch device 100 in accordance with preferred embodiment is illustrated. The programmable latch device 100 includes a programmable element, in this embodiment a fuse F4, that is integrated into the latch. Fuse F4 can be any suitable type of fuse that is programmed by drawing relatively large amounts of current through the fuse, such as a suitable polysilicon fuse. The programmable latch device 100 also includes transistors T1, T2, T3, T5 and T6. These transistors operate to turn the state of the fuse F4 into a reliable digital output that can be used to control or otherwise personalize semiconductor devices, with that output provided at the illustrated OUT node. The programmable latch device 100 has four input nodes, VSOURCE, PROGRAM, SELECT and SET.

Transistor T1 acts as a programming transistor, providing the current drain needed to program the programable element. Transistor T2 acts as feedback transistor, turning off transistor T1 when VSOURCE is high and a high PROGRAM signal is not being passed through transistor T5. Transistor T3 acts as a setting transistor, determining whether the VSOURCE signal is passed to the gate of transistor T1. Transistor T5 acts as a selecting transistor, determining whether the PROGRAM input is passed to the gate of the programming transistor. Transistor T6 acts as a control transistor, receiving the OUT signal and cutting off the path between VSOURCE and the gate of transistor T1 when the OUT is high.

The VSOURCE input is connected to a power source, generally the chip internal voltage, and provides the current used to program the fuse. As will be explained in more detail later, the VSOURCE input should be switchable, as it needs to be low during start up for a read operation. The PROGRAM and SELECT inputs are used to selectively turn on transistor T1, which in turn provides the current used to program fuse F4 and initializing the latch to the OUT=0 state. The SET input is used to selectively facilitate the reading of the programmable latch device output OUT.

In the preferred embodiment, transistor T1 is selected to have a width to length ratio that is much greater than transistor T2. This allows transistor T1 to supply the current needed to program fuse F4 when in programming mode.

Because transistor T1 can program the fuse, care must be taken to insure that it does not inadvertently program the fuse during power up or during a latch read.

The operation of the programmable latch device 100 will now be described. In particular, it will be described how the programmable latch device 100 operates to provide a reliable high OUT signal after power-up when the fuse is intact, and a reliable low OUT signal after power up when the fuse has been programmed (e.g., blown).

Figure 2:
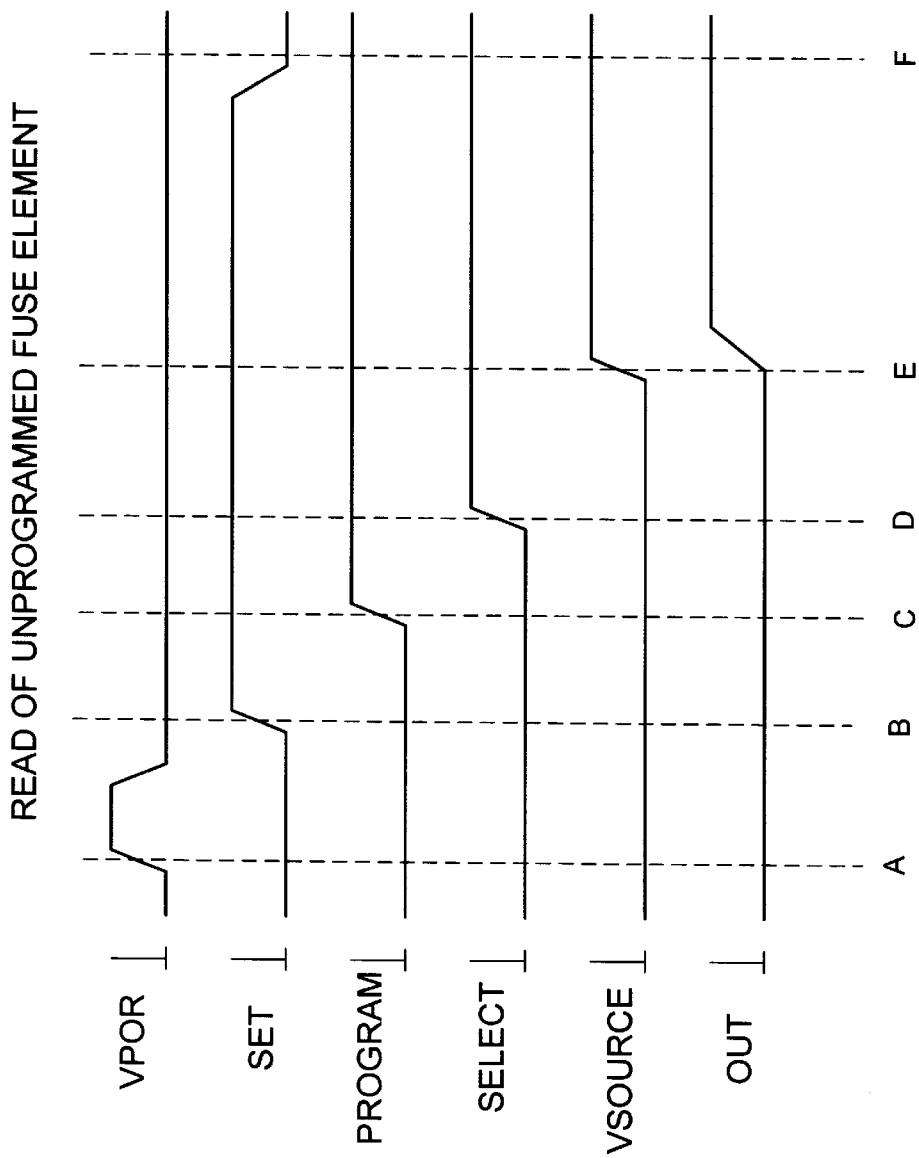
FIG. 2 is wave voltage diagram of a read operation of the preferred embodiment programmable latch device.

Turning now to FIG. 2, a voltage waveform of the various inputs and outputs of programmable latch device 100 is illustrated. Specifically, FIG. 2 illustrates the waveforms for a read operation when the fuse F4 is intact.

Referring to FIGS. 1 and 2 collectively, when a read operation is to be performed, a pulse first appears on VPOR at time A. VPOR is an initialization pulse, called power-on-reset, designed to put all circuits into a known state. Then at time B, the SET input goes high, turning off transistor T3. This prevents current from flowing from VSOURCE, through transistors T3 and T6, to the gate of the programming transistor. As will be explained later, transistor T3 needs to be kept off at least until T5 has been turned off by the SELECT input.

At time C, the PROGRAM input goes high. Because SELECT is still low, the high signal is passed to the drain of transistor T2 and the gate of transistor T1. At time D, the SELECT input goes high, turning off transistor T5. Once T5 has been turned off, the programmable latch device can be powered up by ramping up VSOURCE. It should be noted that before the SELECT input turned off transistor T5 at time D, the PROGRAM input briefly turned on transistor T1. Thus, the OUT signal was initially and briefly held low by transistor T1. Care must be taken to insure that transistor T1 is turned off before VSOURCE voltage ramps up. Otherwise, current provided by VSOURCE and drained through transistor T1 would inadvertently blow fuse F4 during a read operation.

Thus, when the programmable latch device 100 is to be read the SET, PROGRAM and SELECT inputs are all taken and held. Then, at time E, the latch is powered up by ramping VSOURCE up to the internal voltage level. This voltage level can be the standard voltage level used for internal devices, e.g., 2.5 volts.

When powered up with the fuse intact, the read operation is as follows. As VSOURCE rises, the high signal passes through the intact fuse F4 to the gate of transistor T2, and turns it on. Turning transistor T2 on pulls its drain low, causing any remaining residue of the high PROGRAM input to disappear and provide a low signal to the gate of transistor T1, thus turning off transistor T1. With transistor T1 turned off, the OUT signal is allowed to rise with the ramp up of VSOURCE.

As stated above, the SET input is initially held high, keeping transistor T3 turned off and thus preventing direct current flow from VSOURCE to the gate of transistor T1. Additionally, because the high latch output OUT is fed back to the gate of transistor T6, transistor T6 is also turned off. Keeping transistors T3 and T6 off helps insure that transistor T1 stays off. Again, with transistor T1 turned off, the OUT signal is allowed to stabilize high at a level equal to VSOURCE.

After power up has stabilized, at time F, the SET input can go low. This turns on transistor T3. However, because OUT has stabilized at the high VSOURCE level, transistor T6 remains off. Because transistor T6 remains off, there remains no current path between VSOURCE and the gate of transistor T1. Thus, transistor T1 stays off, and the OUT node remains at the high VSOURCE.

After time F, the output OUT of the programmable latch device 100 has stabilized to its final value, in this case with a high OUT signal. Thus, the programmable latch device 100 provides a reliable high OUT signal when powered up with the fuse F4 intact. The programmable latch device 100 thus reads the fuse state and provides a solid digital output indicative of that state that can be used to program, personalize, or otherwise control other devices.

Figure 3:
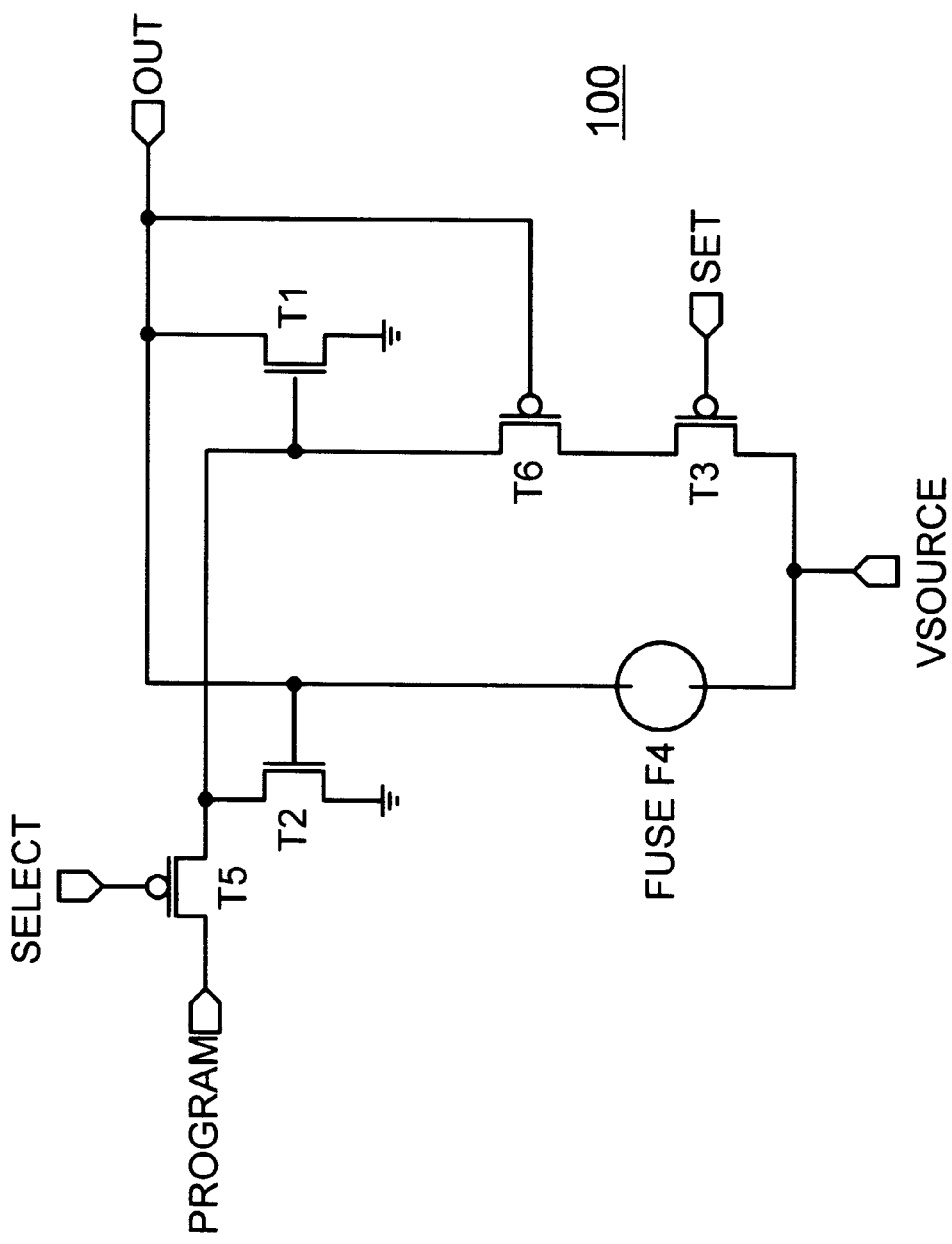
FIG. 3 is a schematic circuit diagram of a programmed programmable latch device in accordance with the preferred embodiment.
Figure 4:
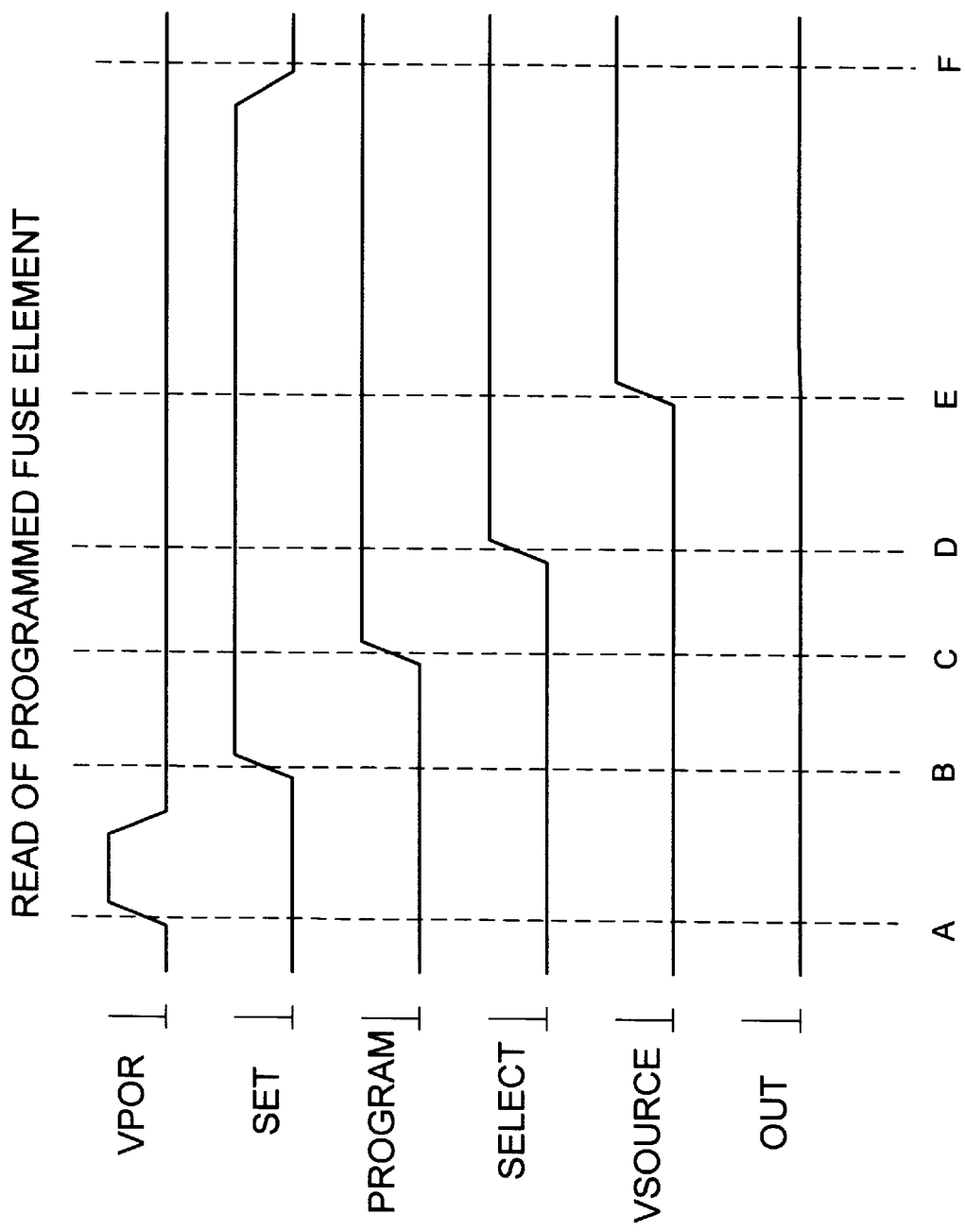
FIG. 4 is wave voltage diagram of a read operation of the preferred embodiment programmable latch device.

Turning now to FIGS. 3 and 4, the programmable latch device 100 is illustrated with the fuse blown in FIG. 3, and a second voltage waveform of the various inputs and outputs of programmable latch device 100 with a blown fuse is illustrated in FIG. 4.

Referring to FIGS. 3 and 4, the read operation is performed in the same manner as illustrated in FIGS. 1 and 2. Specifically, the SET, PROGRAM and SELECT inputs are all taken and held high at times B, C and D respectively. It should again be noted that before the SELECT input turned off transistor T5 at time D, the PROGRAM input briefly turned on transistor T1. Thus, the OUT signal was again initially held low by transistor T1. Then, at time E, the latch is powered up by ramping VSOURCE up to the internal voltage level.

When VSOURCE rises with the fuse F4 having been previously blown, the gate of transistor T2 is unaffected, and transistor T2 stays off. With transistor T2 remaining off, the gate of transistor T1 is unaffected by the ramp up of VSOURCE Additionally, as mentioned above, the SET input is held high as VSOURCE is ramped up in voltage, keeping transistor T3 turned off. This ensures that there is also no path from VSOURCE to the gate of T1 through transistors T3 and T6.

As stated above, the OUT signal is initially low as VSOURCE starts to ramp up. Because OUT is low prior to SET going high, OUT will remain low as VSOURCE ramps up. With OUT low, transistor T6 is turned on. However, because transistor T3 is still off, the gate of transistor T1 is still unaffected by VSOURCE.

Next, at time F, the SET input goes low, turning on transistor T3. With both transistor T3 and transistor T6 on, there is a path between VSOURCE and the gate of transistor T1. Thus, the high VSOURCE turns on transistor T1. This latches the final output and thus holds OUT low. Thus, the programmable latch device 100 provides a reliable low OUT signal when powered up with the blown fuse F4. The programmable latch device 100 thus reads the fuse state and provides a solid digital output that is indicative of that state and can be used to program, personalize or otherwise control other devices.

The operation to program the programmable latch device 100 will now be described. Again, programming the programmable latch device 100 is done by providing sufficient flow through the fuse F4 such that the fuse is broken down. The current used to blow fuse F4 will be provided by VSOURCE and drained through transistor T1. To facilitate this, transistor T1 is selected to have a width to length ratio that is much greater than transistor T2 For example, transistor T1 will need to supply up to 2 milliamps of current to program a typical polysilicon fuse.

Programming fuse F4 is accomplished by selecting the desired latch using the SELECT input and transistor T5. Again, in many embodiments, the banks of programmable latch devices 100 will be provided to facilitate the customization and personalization of other devices. The SELECT input and transistor T5 allows the various latches to be individually selected for programming.

Figure 5:
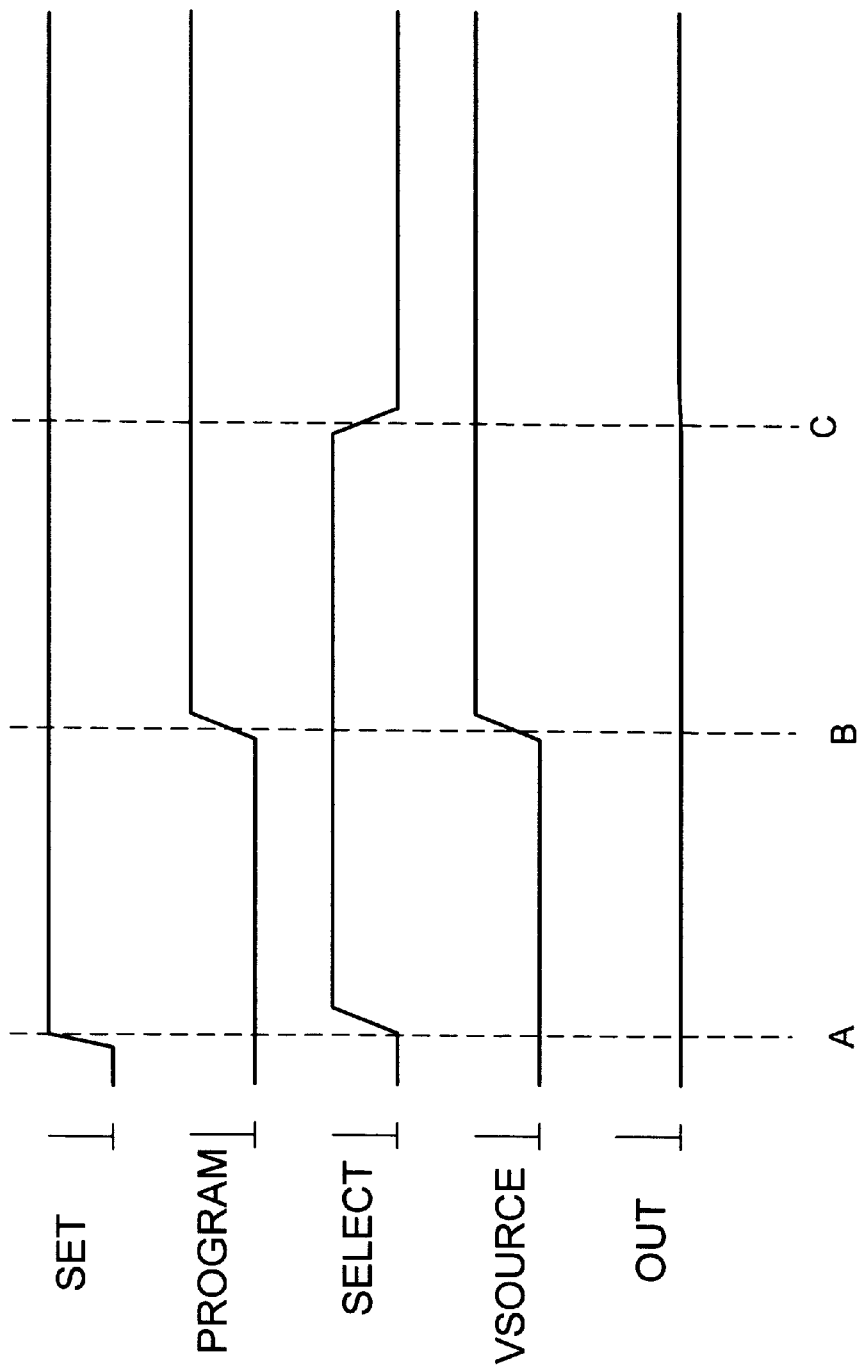
FIG. 5 is wave voltage diagram of a program operation of the preferred embodiment programmable latch device.

Turning now to FIG. 5, the input and output voltage waveforms associated with programming the programmable latch device 100 are illustrated. In particular, programming is started by setting the SET and SELECT input high at time A to turn transistors T3 and T5 off. Then at time B, the PROGRAM input and the VSOURCE rise together. Then at time C, the SELECT input goes low, and transistor T5 is turned on. This provides the high PROGRAM input to the gate of transistor T1. Because of the size of the transistor T1, enough current is drained by transistor T1 through fuse F4 (and from VSOURCE) to reliably blow fuse F4.

In some cases it may be desirable to allow VSOURCE to rise to a higher level during programming than it would during a read operation. This increases the likelihood of reliable blowing of the fuse during programming while minimizing the chances of a inadvertent blowing during a read operation. For example, the VSOURCE may be set to the external supply voltage of 3.3 V, or even a higher amount.

With the fuse F4 so programmed, the programmable latch device 100 will reliably provide a low OUT signal when read as described with reference to FIGS. 3 and 4.

Figure 6:
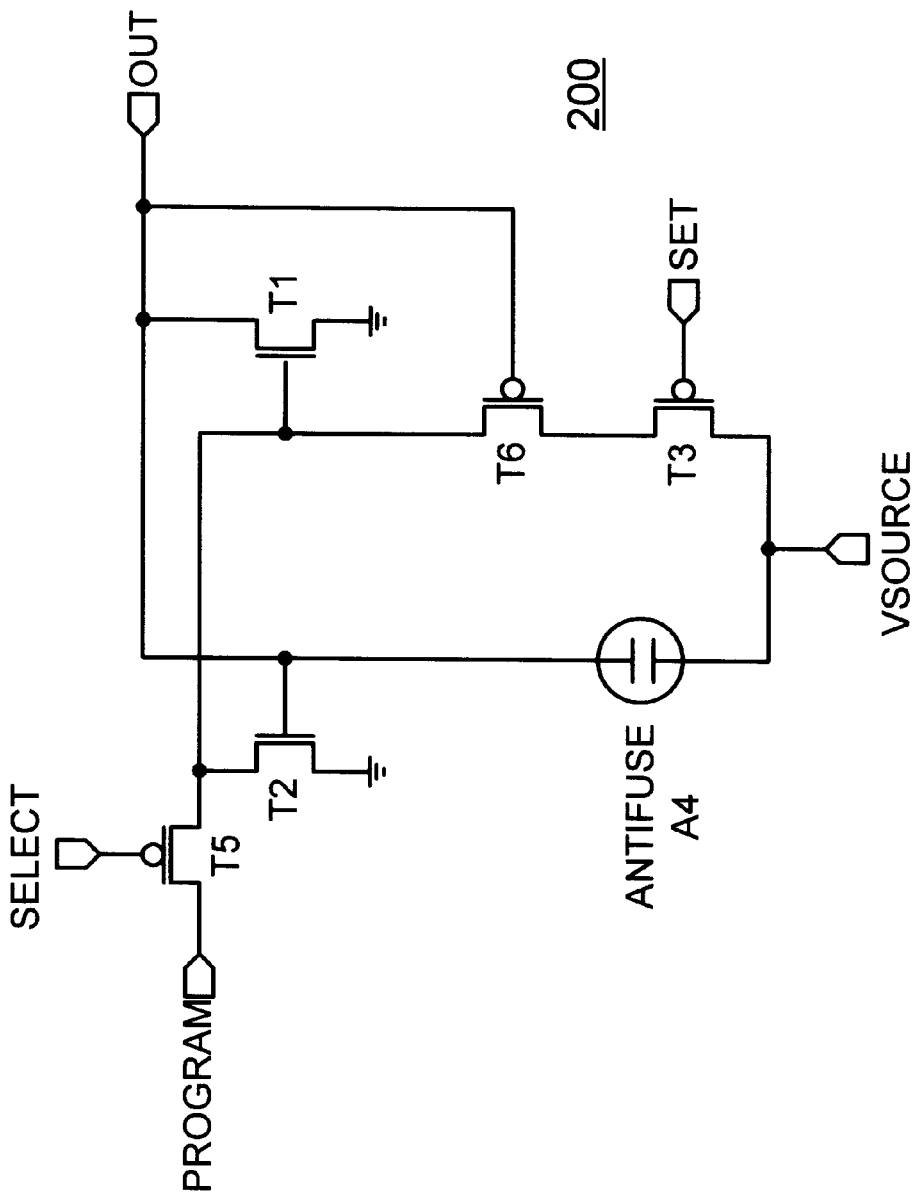
FIG. 6 is a schematic circuit diagram of a programmable latch device in accordance with a second preferred embodiment.

As described above, the preferred embodiments of the present invention can be used with different types of programable elements. For example, the fuse F4 in programmable latch device 100 can be replaced with a suitable antifuse. Turning now to FIG. 6, a second embodiment of the present invention is illustrated. In this embodiment, a antifuse A4 is used as the programmable element in a programmable latch device 200.

Again, antifuses essentially operate in the opposite manner as a normal fuse. Before programming, the antifuse is essentially an open circuit. When sufficient current and voltage is applied to the antifuse, the antifuse breaks down or otherwise programs and becomes a connected circuit. Thus, once programmed, a minimal voltage applied can cause current to flow.

Antifuses are commonly implemented as capacitors. When a sufficiently high voltage us applied to the capacitor, the dielectric breaks down, causing the capacitor to become a closed circuit. The programming voltage is generally selected such that it is large enough to cause dielectric breakdown and is greater than the operating voltage, but not so high as to damage other dielectric structures on the chip. Generally, since the time needed to program is short, overvoltage can be tolerated for these periods of time.

The capacitor in the antifuse can be formed using any suitable technique, such as diamond like carbon dielectric which may be adjusted by a combination of properties and thickness to program at different voltages. The dielectric may be formed between polysilicon and substrate, metal and polysilicon, two metal layers, etc.

Of course, the second embodiment is not limited to capacitor implemented antifuses, and can be provided using any suitable antifuse technology.

The programmable latch device 200 operates essentially in the same manner as programmable latch device 100, except that a high OUT signal during a read is indicative of a programmed antifuse A4. Likewise, a low OUT signal during a read is indicative of an unprogrammed antifuse. Otherwise, the operation of reading the programmable latch device 200 is essentially identical to that of device 100.

It should be noted however that in the case of a antifuse, the transistor T1 can be a relatively smaller device because it is not required to handle the large amounts of current used to blow a regular fuse. Thus, the transistor T1 need only handle current on the order of 100 microamps in some implementations. This has the advantage of further reducing the size of programmable latch device 200.

The operation of programming the programmable latch device 200 is also essentially identical, except that in some cases a higher voltage for VSOURCE is needed to reliably program the antifuse A4.

Figure 7:
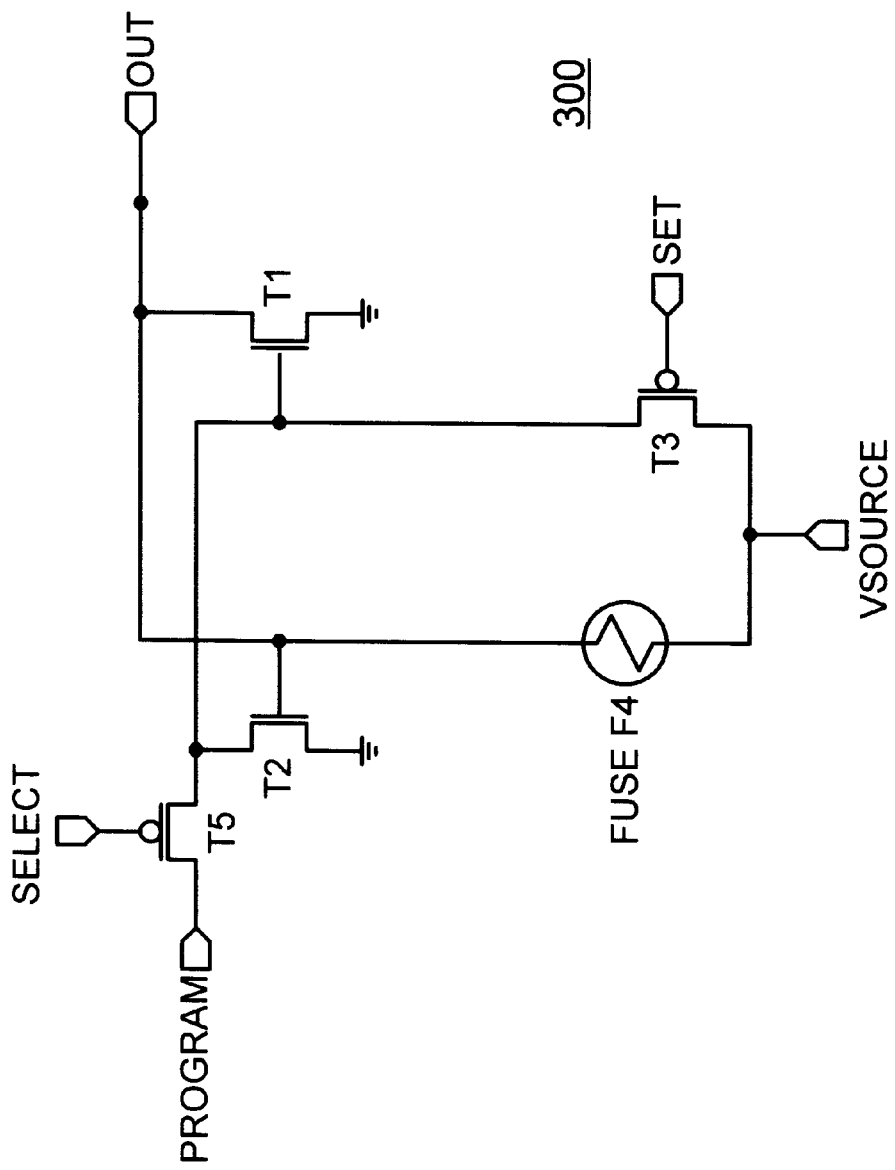
FIG. 7 is a schematic circuit diagram of a programmable latch device in accordance with a third embodiment.
Figure 8:
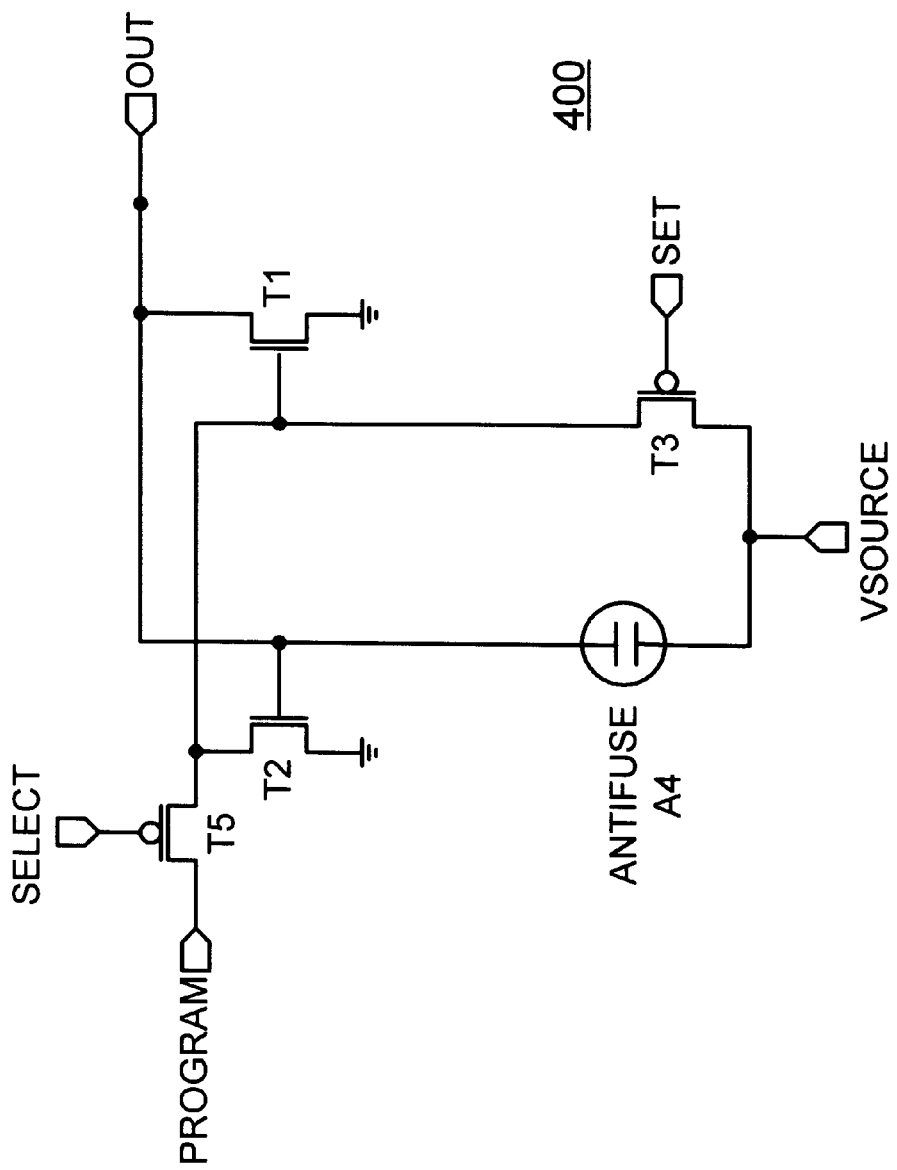
FIG. 8 is a schematic circuit diagram of a programmable latch device in accordance with a fourth embodiment.

Turning now to FIGS. 7 and 8, a third embodiment programmable latch device 300 and a fourth embodiment programmable latch device 400 are illustrated. Programmable latch devices 300 and 400 again use a fuse and an antifuse as programmable elements respectively. Programmable latch devices 300 and 400 differ from devices 100 and 200 in that transistor T6 and the feedback path from OUT to the gate of transistor T6 has been eliminated. This provides even further device size minimization.

Thus, these embodiments would generally be preferred only when the greater DC current from cross over currents can be tolerated and/or minimized by the use of relatively high resistance in the other transistors. Additionally, these embodiments have a slightly greater risk of inadvertent programming during initialization at the beginning of a latch read.

In these embodiments, it is generally preferably that the width to length ratio of transistor T3 be less than the width to length ratio of transistor T5, which likewise has a width to length ratio less than transistor T1.

Figure 9:
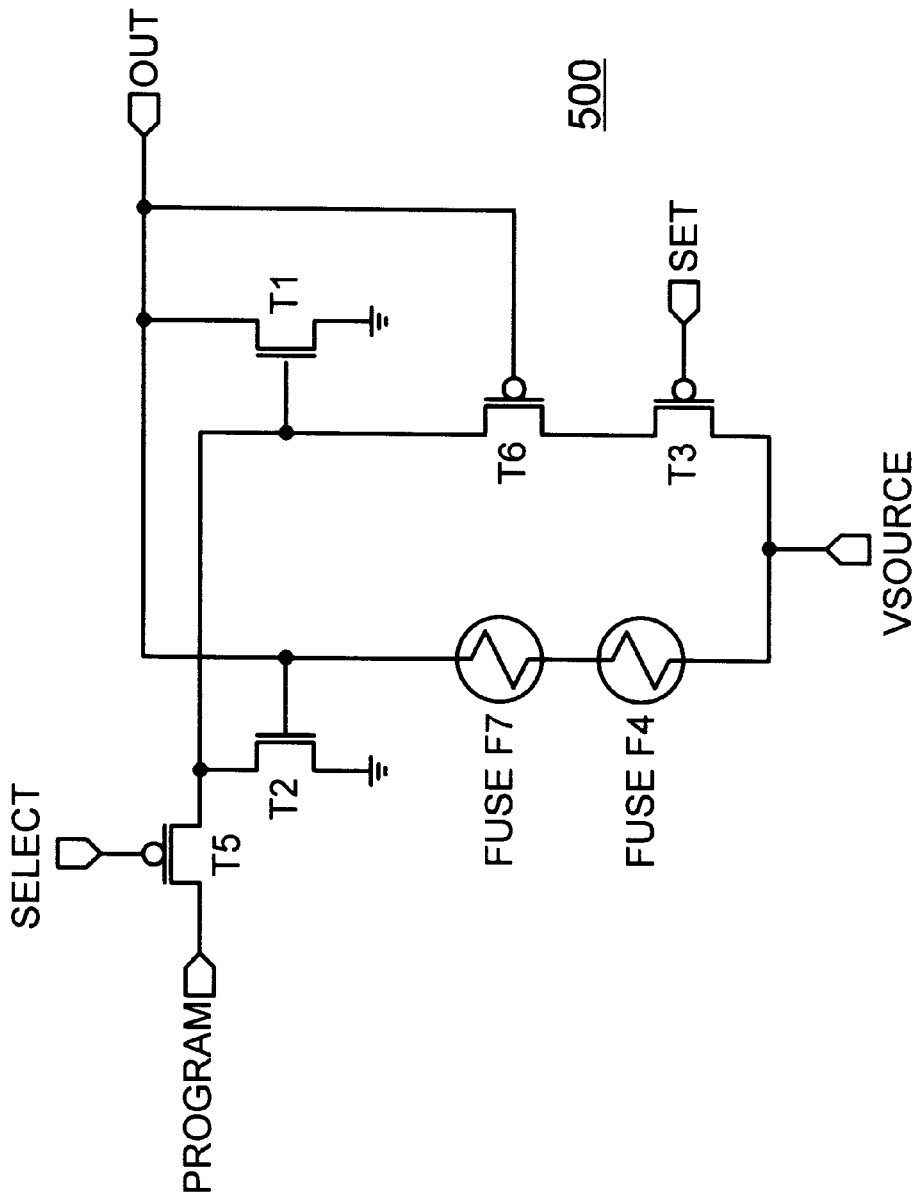
FIG. 9 is a schematic circuit diagram of a programmable latch device in accordance with a fifth embodiment.

In a fifth embodiment of the present invention, a second fuse is added in series with the original fuse. Turning now to FIG. 9, a fifth embodiment programmable latch device 500 is illustrated that includes a second fuse F7 in addition to the fuse F4. This second fuse can be used to provide a an even greater density advantage. In particular, in the preferred embodiment, the second fuse F7 is a fuse that is blown by laser ablation or other similar technique. Additionally, the fuse F7 preferably has the ability to carry the current needed to blow the first fuse F4. Thus, it becomes possible to use a laser or other technique to program the device at the wafer level using laser fuse F7, or program the device using the electronic method described with reference to FIGS. 1 and 4. Thus, the same programmable latch device can be used to provide both the functionality of a laser ablation fuse and an electronically programmed fuse. The selection of which fuse could then depend upon a particular need, such as cost, etc.

Thus, the present invention provides a programable latch device for use in personalizing a semiconductor device is provided that overcomes the limitations of the prior art. The preferred embodiment programmable latch device can use both fuses and antifuses as programmable elements. The programmable latch device provides a solid digital output indicative of the state of the programmable device, and can be reliably read to provide customization and personalization of associated semiconductor devices. The preferred embodiment programable latch device includes an integrated fuse or antifuse as a programmable element in the latch device. By integrating the programmable element into the fuse, device size and complexity is minimized. In particular, the number of transistors required drops considerably when compared to prior art approaches.

While the invention has been particularly shown and described with reference to preferred exemplary embodiments thereof, it will be understood by those skilled in the art that variations in form and detail may be made therein without departing from the spirit and scope of the invention. For example, the programmable latch device could be implemented using circuit duals constructed by interchanging P and N type transistors and supply voltages. As another example, while the preferred embodiment has been illustrated as implemented using CMOS technologies, other device technologies could be used.

What is claimed is:

1. A programmable latch device, the programmable latch device comprising:

a) a latch, the latch including a voltage source input and an output; and b) a programmable element integrated into the latch such that when the programmable element is unprogrammed, and the latch is powered up through the voltage source input, the latch output goes to a first state, and when the programmable element is programmed, and the latch is powered up through the voltage source input, the latch output goes to a second state, wherein the latch additionally comprises:

i) a programming transistor having a source, a drain and a gate, the programming transistor drain coupled to the programmable element such that it can drain current from the voltage source input through the programmable element; and ii) a setting transistor having a source, a drain and a gate, the setting transistor gate receiving a set input and selectively passing the voltage source to the programming transistor gate.

2. The programmable latch device of claim 1 wherein the programmable element comprises a fuse.

3. The programmable latch device of claim 1 wherein the programmable element comprises an antifuse.

4. The programmable latch device of claim 1 wherein the latch additionally comprises:

(iii) a control transistor having a source, a drain and a gate, the control transistor gate coupled to the programmable element; and (iv) a select transistor having a source, a drain and a gate, the select transistor gate receiving a select input, the select transistor selectively passing a program input to the control transistor drain and the programming transistor gate.

5. The programmable latch device of claim 4 wherein the programming transistor has a width to length ratio greater than the control transistor.

6. The programmable latch device of claim 1 wherein the latch additionally comprise a feedback transistor having a source, a drain and a gate, the feedback transistor receiving the output and selectively passing the voltage source to the programming transistor gate.

7. The programmable latch device of claim 6 wherein the selecting transistor, the setting transistor and the control transistor comprise P channel transistors and wherein the feedback transistor and the programming transistor comprise N channel transistors.

8. A programmable latch device, the programmable latch device comprising:

a) a latch, the latch including a voltage source input and an output; and b) a programmable element integrated into the latch such that when the programmable element is unprogrammed, and the latch is powered up through the voltage source input, the latch output goes to a first state, and when the programmable element is programmed, and the latch is powered up through the voltage source input, the latch output goes to a second state and wherein the programmable element comprises a first fuse, and wherein the programmable latch device further comprises a second fuse in series with the first fuse, and wherein the second fuse is designed to be programmed by laser ablation.

9. A programmable latch device, the programmable latch device comprising:
   a) a programming element; the programmable element coupled to a voltage source input and an output;
   b) a latch, the programmable element integrated into the latch such that when the programmable element is unprogrammed, and the latch is powered up through the voltage source input, the output goes to a first state, and when the programmable element is programmed, and the latch is powered up through the voltage source input, the output goes to a second state a latch, the latch including:
      i) a programming transistor having a source, a drain and a gate, the programming transistor drain coupled to the programmable element such that it can drain current from the voltage source input through the programmable element; and
      ii) a select transistor having a source, a drain and a gate, the select transistor gate receiving a select input, the select transistor selectively passing a program input to the programming transistor gate.

10. The programmable latch device of claim 9 wherein the programmable element is a fuse capable of being programmed by drawing current through the fuse by the programming transistor.

11. The programmable latch device of claim 9 wherein the programmable element is an antifuse capable of being programmed by drawing current through the fuse by the programming transistor.

12. The programmable latch device of claim 9 wherein the latch further comprises a feedback transistor having a source, a drain and a gate, the feedback transistor gate coupled to the programmable element.

13. The programmable latch device of claim 9 wherein the latch further comprises a setting transistor having a source, a drain and a gate, the setting transistor gate receiving a set input and selectively passing the voltage source to the programming transistor gate.

14. The programmable latch device of claim 13 wherein the latch further comprises a control transistor having a source, a drain and a gate, the control transistor receiving the output and selectively passing the voltage source to the programming transistor gate.

15. The programmable latch device of claim 9 wherein the programming transistor has a width to length ratio greater than the feedback transistor.

16. The programmable latch device of claim 9 further comprising a second programming element in series with the programming element.

17. A programmable latch device, the programmable latch device comprising:
   a) a programming element; the programmable element coupled to a voltage source input and an output;
   b) a programming transistor having a source, a drain and a gate, the programming transistor drain coupled to the programmable element such that it can drain current from the voltage source input through the programmable element;
   c) a feedback transistor having a source, a drain and a gate, the feedback transistor gate coupled to the programmable element;
   d) a control transistor having a source, a drain and a gate, the control transistor receiving the output and selectively passing the voltage source to the programming transistor gate;
   e) a select transistor having a source, a drain and a gate, the select transistor gate receiving a select input, the select transistor selectively passing a program input to the control transistor drain and the programming transistor gate; and
   f) a setting transistor having a source, a drain and a gate, the setting transistor gate receiving a set input and selectively passing the voltage source to the programming transistor gate.

18. The programmable latch device of claim 17 wherein the programming element comprises a fuse.

19. The programmable latch device of claim 17 wherein the programming element comprises an antifuse.

20. The programmable latch device of claim 17 wherein the selecting transistor, the setting transistor and the control transistor comprise P channel transistors and wherein the feedback transistor and the programming transistor comprise N channel transistors.

21. The programmable latch device of claim 17 wherein the programming transistor has a width to length ratio greater than the feedback transistor.

22. The programmable latch device of claim 17 further comprising a second programming element in series with the programming element.

* * * * *